(12) United States Patent
Zhong et al.

(10) Patent No.: US 10,559,536 B2
(45) Date of Patent: Feb. 11, 2020

(54) MULTI-LAYER CONDUCTORS FOR NOISE REDUCTION IN POWER ELECTRONICS

(71) Applicant: ABB Schweiz AG, Baden (CH)

(72) Inventors: Sheng Zhong, Hillsborough, NC (US); Jing Xu, Cary, NC (US); Liming Liu, Cary, NC (US); Elio Alberto Perigo, Raleigh, NC (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/018,933

(22) Filed: Jun. 26, 2018

(65) Prior Publication Data

US 2019/0393161 A1    Dec. 26, 2019

(51) Int. Cl.
*H01L 23/552* (2006.01)
*H01L 23/498* (2006.01)
(Continued)

(52) U.S. Cl.
CPC ...... *H01L 23/552* (2013.01); *H01L 21/32051* (2013.01); *H01L 23/49866* (2013.01);
(Continued)

(58) Field of Classification Search
CPC ......... H01L 21/32051; H01L 23/49866; H01L 23/5389; H01L 23/552; H05K 1/0218; H05K 1/185
See application file for complete search history.

(56) References Cited

U.S. PATENT DOCUMENTS

| 2002/0050632 A1* | 5/2002 | Tuttle | H01L 23/552 |
| | | | 257/678 |
| 2009/0045488 A1* | 2/2009 | Chang | H01L 23/552 |
| | | | 257/659 |

(Continued)

FOREIGN PATENT DOCUMENTS

EP    1870907 A1    12/2007

OTHER PUBLICATIONS

Y. Liang, "Dissertation: Integrated frequency-selective conduction transmission-line EMI filter," Virginia Polytechnic Institute and State University, Blacksburg, VA, 2008.

(Continued)

*Primary Examiner* — Allan R Wilson
(74) *Attorney, Agent, or Firm* — Taft Stettinius & Hollister LLP; J. Bruce Schelkopf

(57) ABSTRACT

A multi-layered conductor comprising one or more conductor layers of an electrically conductive material and one or more shielding layers of a soft magnetic material. The shielding layer can be coated onto the conductor layer and has a lower conductivity and a higher magnetic permeability than the electrically conductive material of conductor layers. The shielding layer can, at least when alternating current (AC) flows through the multi-layered conductor at relatively high frequencies, provide a separate power path for at least a portion of the high frequency AC current, as well as absorb at least a portion of the high frequency noises associated with that separated high frequency AC current. Additionally, (Continued)

the shielding layer can be separated from the conductor layer at an output end of the multi-layered conductor so that output ends of the shielding layer and conductor layer can be electrically connected to different electrical devices or components.

14 Claims, 5 Drawing Sheets

(51) Int. Cl.
*H05K 9/00* (2006.01)
*H01L 21/3205* (2006.01)
*H01L 23/538* (2006.01)
*H05K 1/18* (2006.01)
*H05K 1/02* (2006.01)
*H05K 3/18* (2006.01)
*H01L 21/285* (2006.01)
*H01L 21/288* (2006.01)
*H05K 3/16* (2006.01)

(52) U.S. Cl.
CPC ....... *H01L 23/5389* (2013.01); *H05K 1/0218* (2013.01); *H05K 1/185* (2013.01); *H05K 9/0084* (2013.01); *H01L 21/288* (2013.01); *H01L 21/2885* (2013.01); *H01L 21/28575* (2013.01); *H01L 23/5383* (2013.01); *H01L 23/5386* (2013.01); *H05K 3/16* (2013.01); *H05K 3/181* (2013.01); *H05K 3/188* (2013.01); *H05K 2201/10166* (2013.01)

(56) References Cited

U.S. PATENT DOCUMENTS

| | | | |
|---|---|---|---|
| 2012/0025355 A1* | 2/2012 | Sasaki | H01L 23/552 257/620 |
| 2016/0093796 A1* | 3/2016 | Arai | H01L 43/02 257/422 |
| 2016/0172580 A1* | 6/2016 | Matsubara | H01L 23/552 257/422 |
| 2017/0287848 A1* | 10/2017 | Kawabata | H01L 23/3114 |
| 2017/0301628 A1* | 10/2017 | Kawabata | H01L 24/97 |
| 2018/0138131 A1* | 5/2018 | Kawabata | H01F 1/26 |

OTHER PUBLICATIONS

R. Chen, S. Wang, J. D. van Wyk and W. G. Odendaal, "Integration of EMI filter for distributed power system (DPS) front-end converter," in Power Electronics Specialist Conference, 2003.

R. Chen, J. D. van Wyk, S. Wang and W. G. Odendaal, "Improving the characteristics of integrated EMI filters by embedded conductive layers," IEEE Transactions on Power Electronics, vol. 20, No. 3, pp. 611-619, 2005.

F. Mayer, "Absorptive low-pass cables: state of the art and an outlook to the future," IEEE Transactions on Electromagnetic Compatibility, vols. EMC-28, No. 1, pp. 7-17, 1986.

T. Sato, S. Ikeda, K. Yamasaw and T. Mizoguchi, "Transmission-line low-pass filter for switching power supplies," in Power Electronics Specialists Conference, PESC 98, 1998.

Alpha Wire, "Alpha Wire," Alpha Wire, 2016. [Online]. Available: http://www.alphawire.com/.

McDermid Inc., "McDermid Performance Solutions," McDermid, Inc., 2016. [Online]. Available: http://www.macdermid.com/.

D. A. Weston and K. McDougall, "Comparative magnetic field shielding effectiveness of thin conductive coatings," Thincoat R&D, 2005.

* cited by examiner

MULTI-LAYER CONDUCTORS FOR NOISE REDUCTION IN POWER ELECTRONICS

BACKGROUND

Embodiments of the present application generally relate to noise reduction for electronic devices. More particularly, but not exclusively, embodiments of the present application relate to multi-layered conductors that include a magnetic shielding for at least reduction of high frequency noises in power electronics.

Electronic devices can generate noises at relatively high frequencies, including, for example, relatively high switching frequencies, that can be disruptive to system performance. Additionally, such high frequencies can contribute to the malfunction of at least the associated electronic device, as well as be generally detrimental to other components of the system. Further, current approaches to reducing such high frequency noises in power electronics often carry relatively high manufacturing costs.

One traditional approach to reducing electromagnetic interference (EMI) is the addition of a reflective LC EMI filter. Yet, reflective LC EMI filters typically involve the use of inductors and capacitors, among a number of other components, which often occupy a relatively large footprint on a printed circuit board (PCB) or other device. Additionally, the inclusion of LC EMI filters can often involve labor-intensive processing steps to install, or otherwise manufacture, the LC EMI filter. Further, the performance of LC EMI filters can be limited as, for example, the filter frequency range for LC EMI filters is often below a few megahertz (MHz). Additionally, attenuation of LC EMI filters can be dependent on source and load impedances, and thus the filter attenuation of LC EMI filters can, at times, be quite different from the actual requirements of a system. Another approach to addressing EMI has been the use of absorptive filters, which can be high-loss elements that attempt to remove EMI via generating more losses in a desired frequency range.

Accordingly, there is room for further development in materials and processes to reduce the noise levels of electronic devices that are operating at relatively high frequencies, including relatively high switching frequencies.

BRIEF SUMMARY

An aspect of an embodiment of the present application is a multi-layered conductor comprising one or more conductor layers comprising an electrically conductive material, and one or more shielding layers that are attached to at least a portion of an outer surface of the one or more conductor layers. The one or more shielding layers can comprise a soft magnetic material, among other materials, having a relatively low conductivity when compared to copper and a higher permeability than the electrically conductive material of the one or more conductor layers.

Another aspect of an embodiment of the present application is a system comprising one or more layers of an electrically conductive material that is arranged on a substrate to provide a plurality of conductors. The system can include a high frequency semiconductor, that is secured to the substrate and that is electrically coupled to one or more of the plurality of conductors. The system can further include one or more layers of a shielding material that is attached to at least a portion of an outer surface of at least one conductor of the plurality of conductors to form a multi-layered conductor. The one or more layers of the shielding material can comprise a material that has a lower conductivity and a higher permeability than the one or more layers of the electrically conductive material.

Additionally, another aspect of an embodiment of the present application is a method that includes positioning one or more layers of an electrically conductive material about a substrate, such as, for example, a printed circuit board, and forming a plurality of conductors on a substrate, the plurality of conductors comprising at least a portion of the one or more layers of the electrically conductive material. The method can further include activating one or more surfaces of at least a portion of at least one conductor of the plurality of conductors and depositing one or more layers of a shielding material on the one or more activated surfaces of the at least one conductor. The deposited one or more layers of the shielding material can comprise a soft magnetic material having a lower conductivity and a higher permeability than the one or more layers of the electrically conductive material.

BRIEF DESCRIPTION OF THE DRAWINGS

The description herein makes reference to the accompanying figures wherein like reference numerals refer to like parts throughout the several views.

Figure 1:
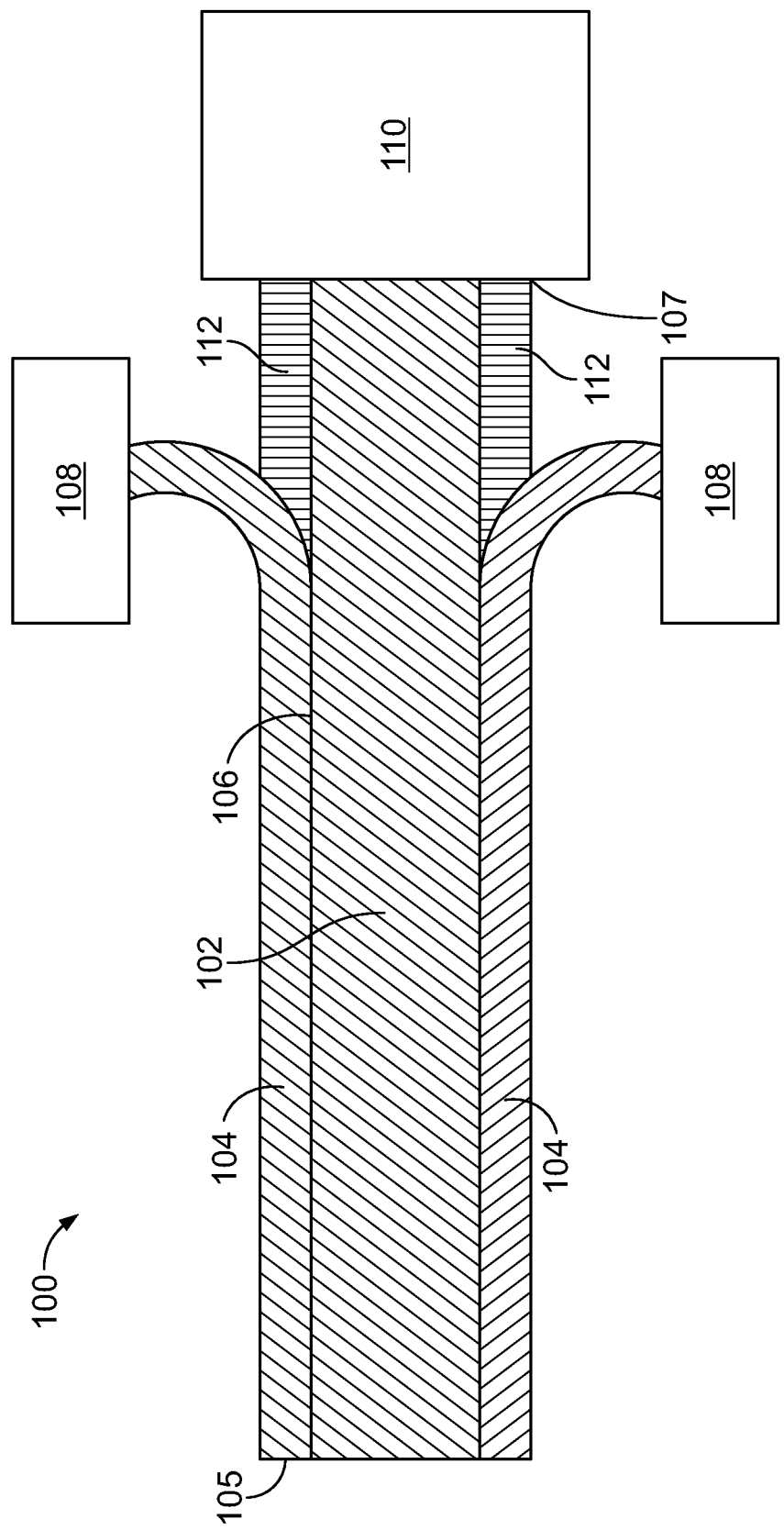
FIG. 1 illustrates a cross sectional view of an exemplary multi-layered conductor according to an illustrated embodiment of the subject application.

The foregoing summary, as well as the following detailed description of certain embodiments of the present application, will be better understood when read in conjunction with the appended drawings. For purposes of illustrating the application, there are shown in the drawings, certain embodiments. It should be understood, however, that the present application is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof.

FIG. 1 illustrates a cross sectional view of an exemplary multi-layered conductor 100 according to an illustrated embodiment of the subject application. The multi-layered conductor 100 can be used in a variety of different applications and electrical devices. For example, according to certain embodiments, the multi-layered conductor 100 can be a conductor on a printed circuit board (PCB). Further, according to at least certain embodiments, the multi-layered conductor 100 can be used to deliver an AC electrical current, to and/or from, an electrical device, component, or power source.

According to the embodiment illustrated in FIG. 1, the multi-layered conductor 100 can comprise one or more conductor layers 102 and one or more shielding layers 104 that extend between a first end 105 and a second end 107 of the multi-layered conductor 100. According to the embodiment depicted in FIG. 1, the first end 105 of the conductor layer 102 can be configured to be electrically coupled to an electrical device, power supply, or other component that provides or delivers an electrical AC current to the multi-layered conductor 100. As discussed below, the second end 107 of the multi-layered conductor 100 can be configured such that at least the conductor layer 102 is electrically coupled to an input of another electrical device or component so that at least a portion of the AC electrical current that passes through the multi-layered conductor 100 is delivered to that other electrical device or component.

The conductor layer 102 can be constructed from a variety of electrically conductive materials. For example, according to certain embodiments, the conductor layer 102 can be constructed from a material having a relatively high degree of electrical conductivity, such as, for example, copper, copper alloy, aluminum, aluminum alloy or silver, among other materials. The shielding layer 104 can, for at least a portion of the multi-layered conductor 100, be positioned about at least a portion of an exterior surface of the conductor layer 102. For example, the shielding layer 104 can be positioned about at least a portion of an outer surface or skin 106 of the conductor layer 102, or, alternatively, can generally encompass at least at various segments along the multi-layered conductor 100, the entire outer surface of the conductor layer 102.

According to the illustrated embodiment, the shielding layer 104 is constructed from a generally soft magnetic material that has relatively high magnetic permeability and resistivity. Alternatively, according to other embodiments, the shielding layer 104 can comprise a ferrite. The material(s) used for the shielding layer 104 can be based on a variety of factors, including, for example, the noise filtering requirements that are at least being attempted to be satisfied though the use of the multi-layered conductor 100, among other considerations. For example, according to certain embodiments, the shielding layer 104 can be constructed from nickel, nickel alloy, cobalt, ferrite, iron and low-carbon steels, iron-silicon alloys, iron-aluminum-silicon alloys, nickel-iron alloys, iron-cobalt alloys, ferrites, amorphous alloys, nickel/phosphorous composites, and combinations thereof, among other materials. Further, the shielding layer 104 can be constructed from a material(s) that having a lower conductivity and a higher magnetic permeability than the material(s) of the conductor layer 102.

For example, according to certain embodiments, the conductor layer 102 can comprise a layer of copper that, at a frequency of 1 kilohertz (KHz), has a conductivity of around $5.8 \times 10^7$ siemens/meters (S/m) and a relative magnetic permeability of 1, while the shielding layer 104 can be constructed, processed, and/or fabricated from nickel to have, at a frequency of 1 kilohertz (KHz), a conductivity of $1.45 \times 10^7$ siemens/meters (S/m) and a relative magnetic permeability of 600. Thus, for example, according to certain embodiments, the level of permeability of the shielding layer 104 can be an order of magnitude higher than the level of permeability of the material of the conductor layer 102.

Further, the multi-layered conductor 100 can be constructed in a variety of manners. For example, according to certain embodiments, the shielding layer 104 can be a coating that is applied to at least a portion of the conductor layer 102 that is positioned or deposited on the PCB 114 and/or directly onto the PCB 114 before conductor layer 102. For example, according to certain embodiments, the multi-layered conductor 100 can be fabricated via sputtering, electrolytic, or electroless deposition of one or more layers of the conductor layer 102 and/or the shielding layer 104 of the multi-layered conductor 100. Alternatively, according to certain embodiments, one or more multi-layered conductors 100 on a printed circuit board (PCB) can be formed using vapor deposition, which can deposit at least the soft magnetic material of the shielding layer 104 onto a desired surface(s) of a PCB, such as, for example, onto at least a portion of an electrically conductive layer or material on the PCB 114. Alternatively, electrodeposition can be utilized to apply multiple layers of the shielding layer 104 to the conductor layer 102. Further, sputtering targets can be provided under vacuum, physical vapor deposition and chemical vapor deposition. However, a variety of other types of plating or coating processes can also be used to apply the shielding layer 104 to the conductor layer 102. Further, according to certain embodiments, the conductive layer 102 can be deposited onto the PCB 114 using techniques similar to those mentioned above with respect to the depositing or coating of the shielding layer 104. Additionally, the shielding layer 104 can be applied directly to the PCB 114, such as, for example, onto an activated surface of the PCB 114.

The shielding layer 104 can be applied to the conductor layer 102 in one or more layers so that the shielding layer 104 has a particular wall thickness between an outer surface of the conductor layer 102 and an outer surface of the shielding layer 104. The particular thickness for the shielding layer 104 can be based on a variety of factors, including, for example, the material(s) used for the shielding layer 104, the noise filtering or shielding requirements, the anticipated frequencies at which AC electrical current will pass through the multi-layered conductor 100, and/or the electrical device in which the multi-layered conductor 100 is being used, among other considerations. For example, the wall thickness of the shielding layer 104 may be from around 1 nanometer (nm) to around 1 millimeter (mm), and more specifically, from between 1 micron to around 100 microns. Additionally, as nickel has been found to possess generally good shielding properties, a shielding layer 104 comprising nickel may generally satisfy shielding requirements with a wall thickness that is less than that of other materials that may be used for the shielding layer 104. Thus, for example, according to certain embodiments, a shielding layer 104 constructed from nickel or nickel alloy may be able to provide sufficient shielding against EMI with a shielding layer 104 wall thickness of less than, or generally equal to, 5 microns.

Figure 2:
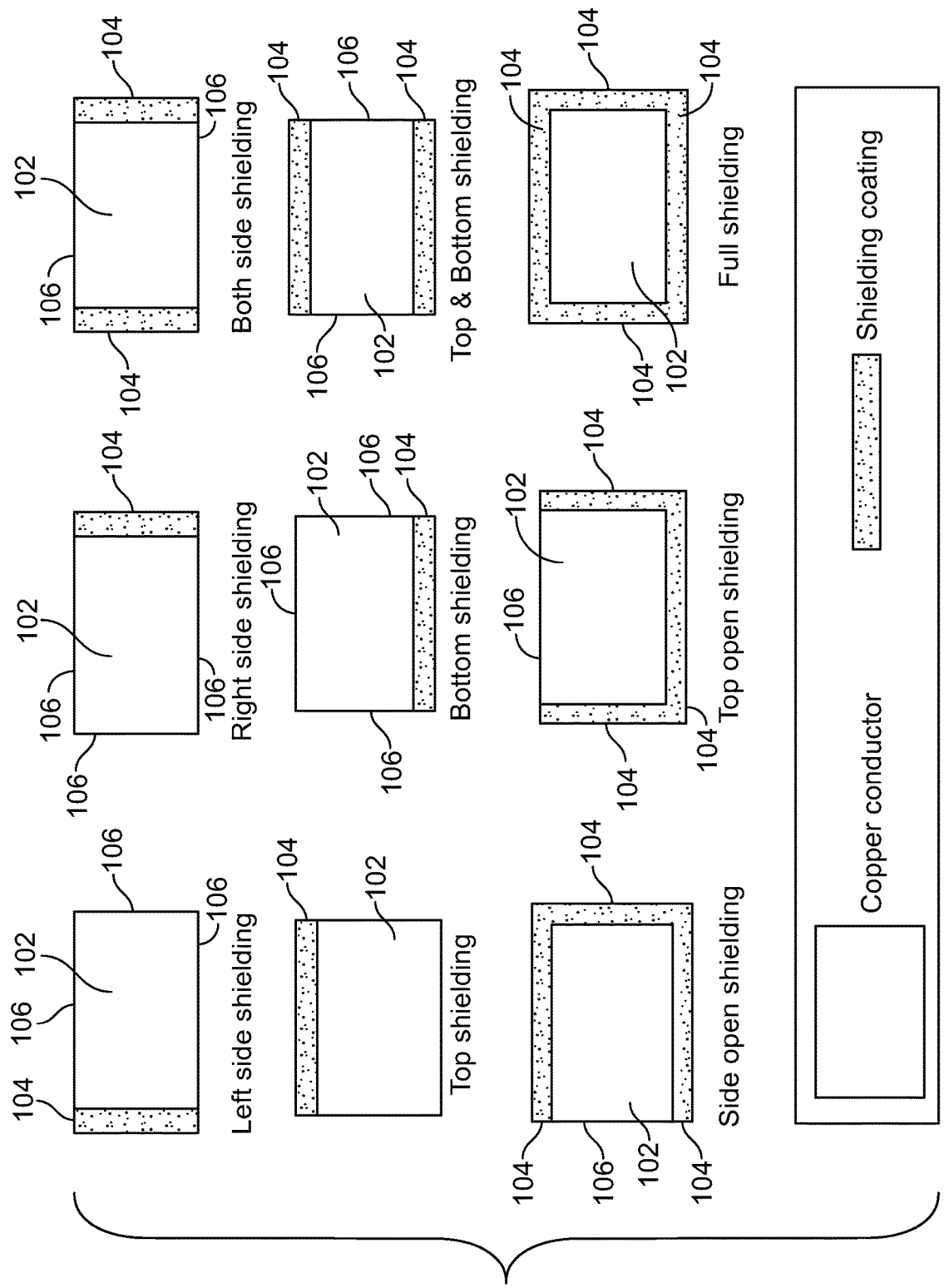
FIG. 2 illustrates a variety of exemplary geometries of a multi-layered conductor in which a shielding layer(s) is/are positioned at a variety of locations about a conductor layer of a multi-layered conductor.

Additionally, the shielding layer 104 can be positioned at a variety of locations relative to the conductor layer 102, as graphically represented, for example, by FIG. 2. More specifically, as shown by FIG. 2, the shielding layer 104 can be positioned about one or more sides of the outer surface 106 of the conductor layer 102. Further, as indicated by FIG. 2, according to certain embodiments the shielding layer 104 may not be positioned about one or more sides or portions of the outer surface 106 of the conductor layer 102. Which portions, or sides, of the conductor layer 102 are, or are not, coated or otherwise covered with the shielding layer 104 can be based on a variety of criteria. For example, according to certain embodiments, the shielding layer 104 may be applied to a particular side(s) of the conductor layer 102 to at least attempt to enhance magnetic shielding in an associated direction. More specifically, for example, in PCB applications in which the PCB includes multiple copper and magnetic layers, the shielding layer 104 could be positioned on the top and/or bottom surfaces of the conductor layer 102, as shown by the center row of configurations in FIG. 2. Alternatively, in embodiments in which the multi-layered conductor 100 is used with an individual inductor, any of the different shielding configurations depicted in FIG. 2 could be employed.

While FIG. 2 illustrates the conductive and shielding layers 102, 104 as having generally square or rectangular cross sectional shape(s), the conductive and shielding layers 102, 104 can have a variety of other cross sectional shapes, including, but not limited to, being circular, non-circular, oval, polygonal, triangular, and combinations thereof, among other shapes. Additionally, the cross sectional shape of the shielding layer may, or may not, be the same or similar to the cross sectional shape of the conductor layer 102.

Selective coating of one or more sides or surfaces of the conductor layer 102 with the shielding layer 104 so as to attain coating geometries similar to those depicted in FIG. 2, among other coating geometries, can be attained in a variety of manners. For example, according to certain embodiments, which surfaces and/or sides of the conductor layer 102 are to, or are not to, receive one or more layers of a shielding layer 104 can be regulated via surface activation. For example, when at least one surface or side of the conductor layer 102 is activated, such as, for example via etching using a weak acid or nickel strike or electro activation, among other manners of surface activation, the shielding layer 104, such as, for example, one or more nickel layers, can generally only be deposited on that activated surface/side, and not deposited on the other non-activated surfaces/sides. In other cases, such as, for example, electroless deposition, nickel layer(s) can be deposited only on the surface of the conductor layer 102 that has been chemically activated. The use of such selective deposition can reduce material cost while achieving similar or improved shielding effects when compared to prior coating or plating techniques, which can thus reduce total manufacturing costs.

Figure 3:
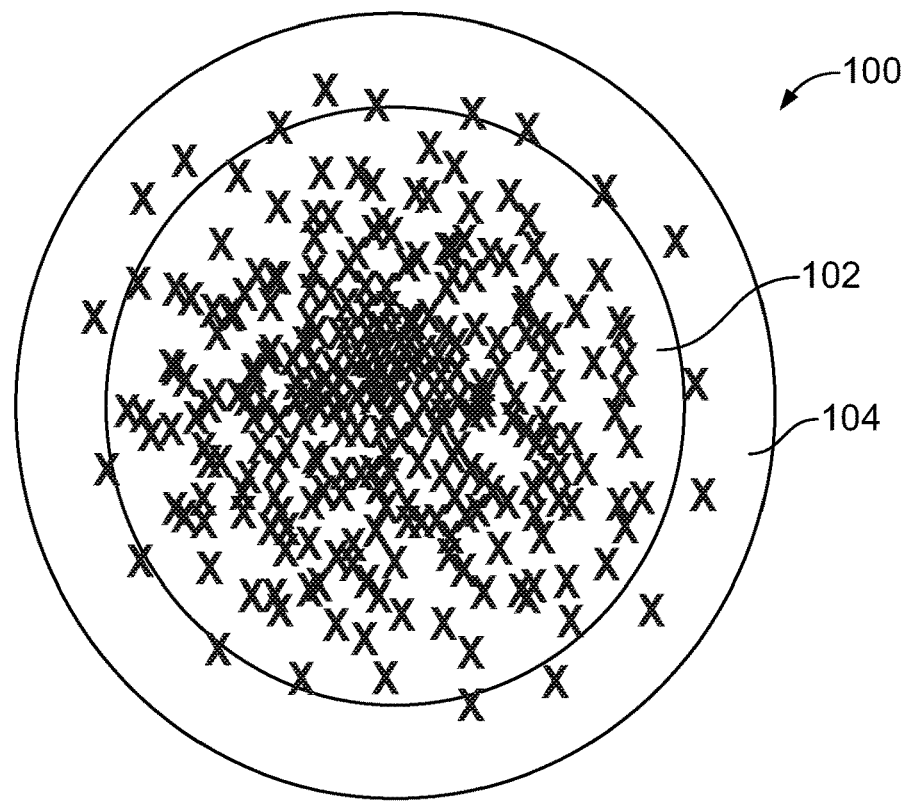
FIG. 3 illustrates a representation of density of an AC electrical current in a section of the multi-layered conductor of FIG. 1 at a relatively low frequency.
Figure 4:
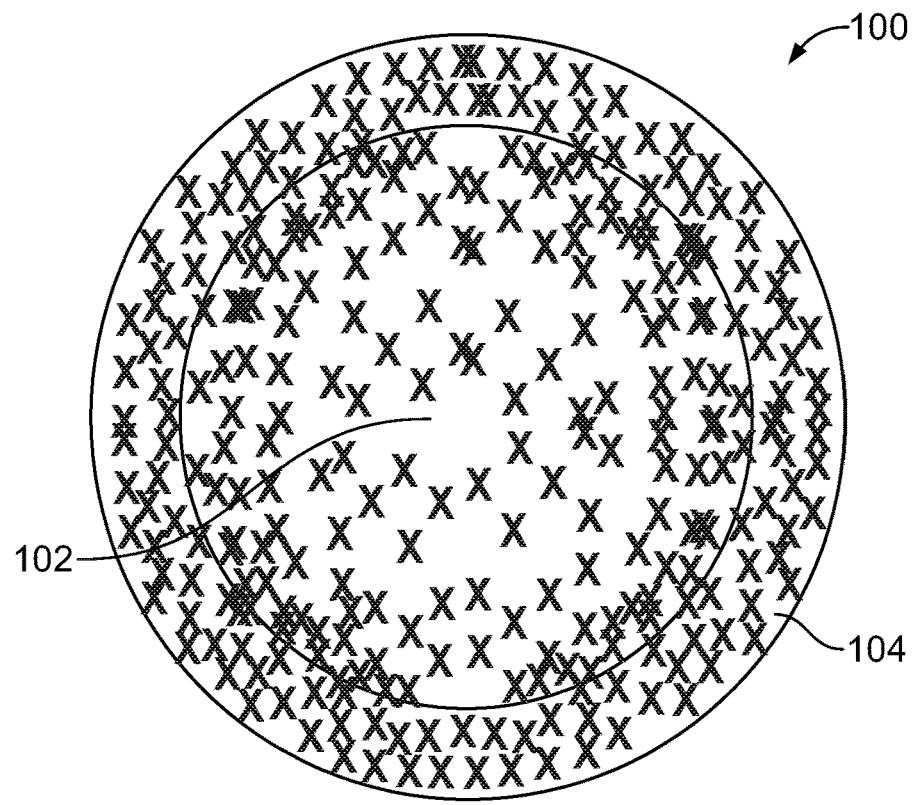
FIG. 4 illustrates a representation of density of an AC electrical current in a section of the multi-layered conductor of FIG. 1 at a relatively high frequency.
Figure 5:
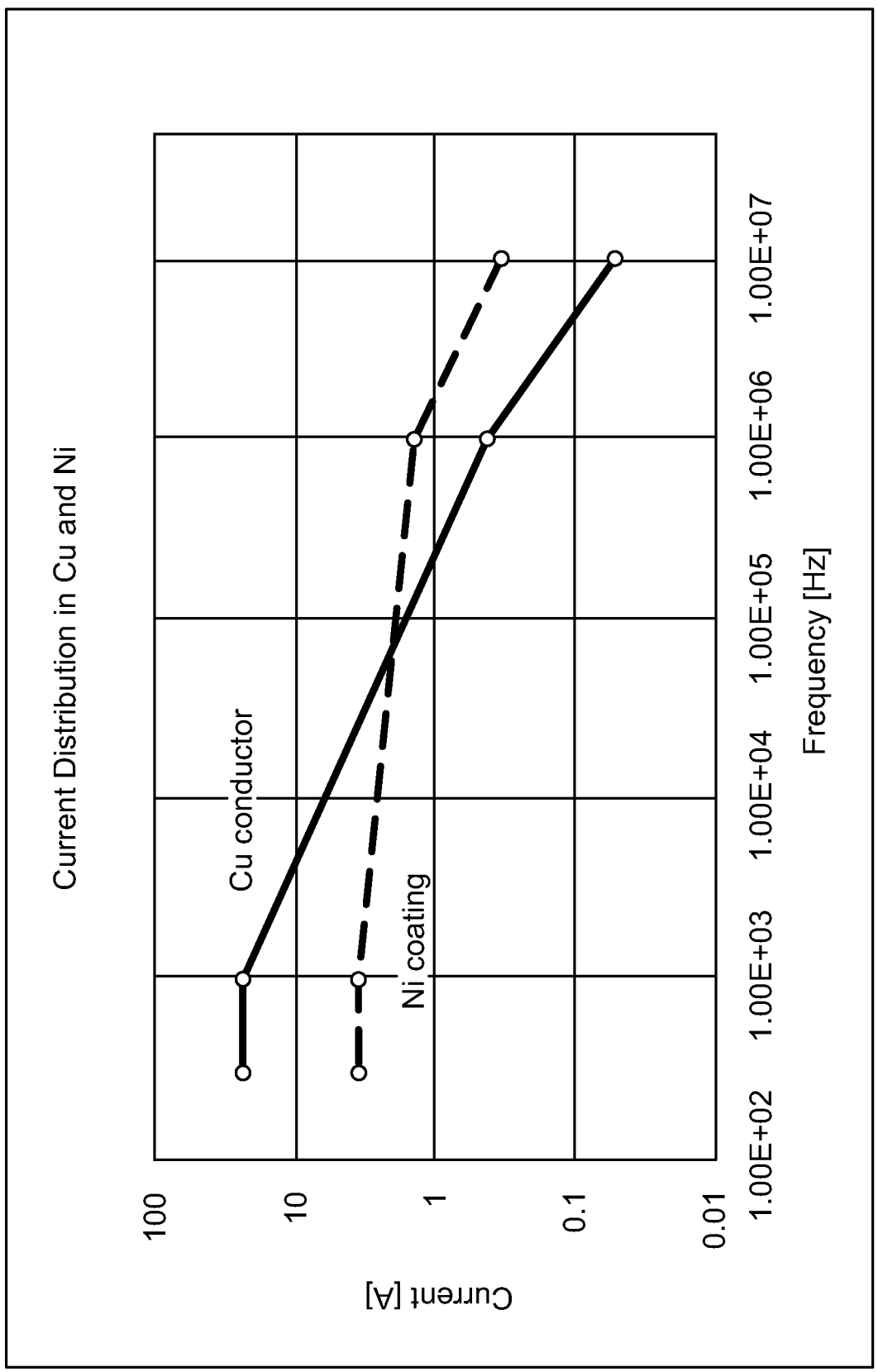
FIG. 5 illustrates a graphical representation of current distribution in an exemplary multi-layered conductor comprising a copper conductor layer and a nickel shielding layer as a function of power frequency.

For at least purposes of discussion, FIGS. 3-5 provide general representations of differences in current density along a portion of the multi-layered conductor 100 at different power frequencies. More specifically, FIG. 3 represents current density along the multi-layered conductor 100 at relatively low operating frequencies, such as, for example, frequencies around 1 KHz, while FIG. 4 depicts current density along the multi-layered conductor 100 at relatively high operating frequencies, such as, for example, frequencies around 10 megahertz (MHz). As shown by at least FIGS. 3 and 5, at relatively low frequencies, AC electrical current flowing through the multi-layered conductor 100 will be primarily conducted through the conductor layer 102. Thus, due at least in part to the conductor layer 102 being constructed from a material having high conductivity and lower impedance than the material of the shielding layer 104, at relatively low frequencies, current density of the AC electrical current flowing through the multi-layered conductor 100 will typically be higher in the conductor layer 102 than the in shielding layer 104. Conversely, as the frequency of the AC electrical current increases, current has a tendency to follow the skin effect in which current generally gravitates toward the outer surface 106 of the conductor layer 102, thereby resulting in the current density within the conductor layer 102 to be larger in proximity to the outer surface 106 than the more inner, central regions of the conductor layer 102. Additionally, with the increase in frequency, the current generally may follow the path with the least impedance, which, in the multi-layered conductor 100, is the shielding layer 104, and thus resulting in the current density in the shielding layer 104 being greater than the current density of the conductor layer 102.

Accordingly, current that has gravitated to the outer surface 106 of the conductor layer 102 in response to an increase in frequency may continue to flow into the shielding layer 104. As a result, at relatively higher frequencies, the current density in the shielding layer 104 may be larger than the corresponding current density in the conductor layer 102, as represented, for example, in FIGS. 4 and 5. For example, according to certain embodiments in which the conductor layer 102 is copper and the shielding layer 104 is nickel, the current density in the shielding layer 104 when AC current is flowing through the multi-layered conductor 100 at a frequency of 10 MHz can be around 20 times larger than when the current is AC current is flowing through the multi-layered conductor 100 at a frequency of 1 KHz.

The migration of current to the shielding layer 104 as the power frequency reaches relatively high frequencies can facilitate a separation of power paths in the multi-layered conductor 100 based on the frequencies of AC electrical current. Further, such power signals can remain separated in the conductor layer 102 and shielding layer 104 based on operating frequency, thereby resulting in relatively successful signal separation and elimination of high frequency noises. Further, by having the majority of the current passing through the shielding layer 104 at higher frequencies, such as, for example, at radio frequencies, the shielding layer 104 can act as an absorptive layer that can provide a shield against the release of noise, such as, EMI, from the multi-layered conductor 100. Moreover, when compared to at least the material of the conductor layer 102, the soft magnetic material of the shielding layer 104 can provide shielding that at least attempts to prevent, or otherwise minimizes, high frequency signals in the form of noise from being received by the multi-layered conductor 100. Thus, by the shielding layer 104 be constructed from a material that both provides a separate power path for at least a portion of the high frequency AC current and which can absorb at least a portion of the high frequency noises associated with that separated high frequency AC current, the multi-layered conductor 100 of the subject application can reduce, and in at least some cases eliminate, high frequency noise. Further, the incorporation of the multi-layered conductor 100 of the subject application can, when compared to at least traditional attempts at high frequency noise reduction, can result in elimination and/or reduction in the size of other noise reduction devices, including, for example, a reduction in the size, or elimination of, and EMI filter.

Additionally, as indicated by FIG. 1, the multi-layered conductor 100 can further minimize the adverse impact of EMI by delivering at least a portion of the relatively high frequency AC current to an electrical device 108, such as, for example, a capacitor, and not to the same electrical device 110 that is electrically coupled to the output of the conductor layer 102. Thus, while the conductor and shielding layers 102, 104 at the first, or input, end 105 of the multi-layered conductor 100 can be electrically coupled to the same electrical device or component, at the second end 107 of the multi-layered conductor 100, the shielding layer 104 can be coupled to an electrical device or component 108, such as, for example a capacitor or capacitor/resistor combination, that is different than the electrical device or component to which the conductor layer 102 is electrically coupled. Additionally, the electrical device or component 108 to which the shielding layer 104 is electrically coupled to at the second end 107 of the multi-layered conductor 100 can also include, in addition to a capacitor or other electrical component, a fixed or variable inductor series with a capacitor that can be configured to regulate cut off frequencies. Further, according to certain embodiments, the separated shielding layer 104 can be separated from the conductor layer 102 at least at the second end 107 of the multi-layered conductor 100 by another, electrically non-conductive-layer, such as, for example, an insulation layer 112, as shown for example in FIG. 1.

Figure 6:
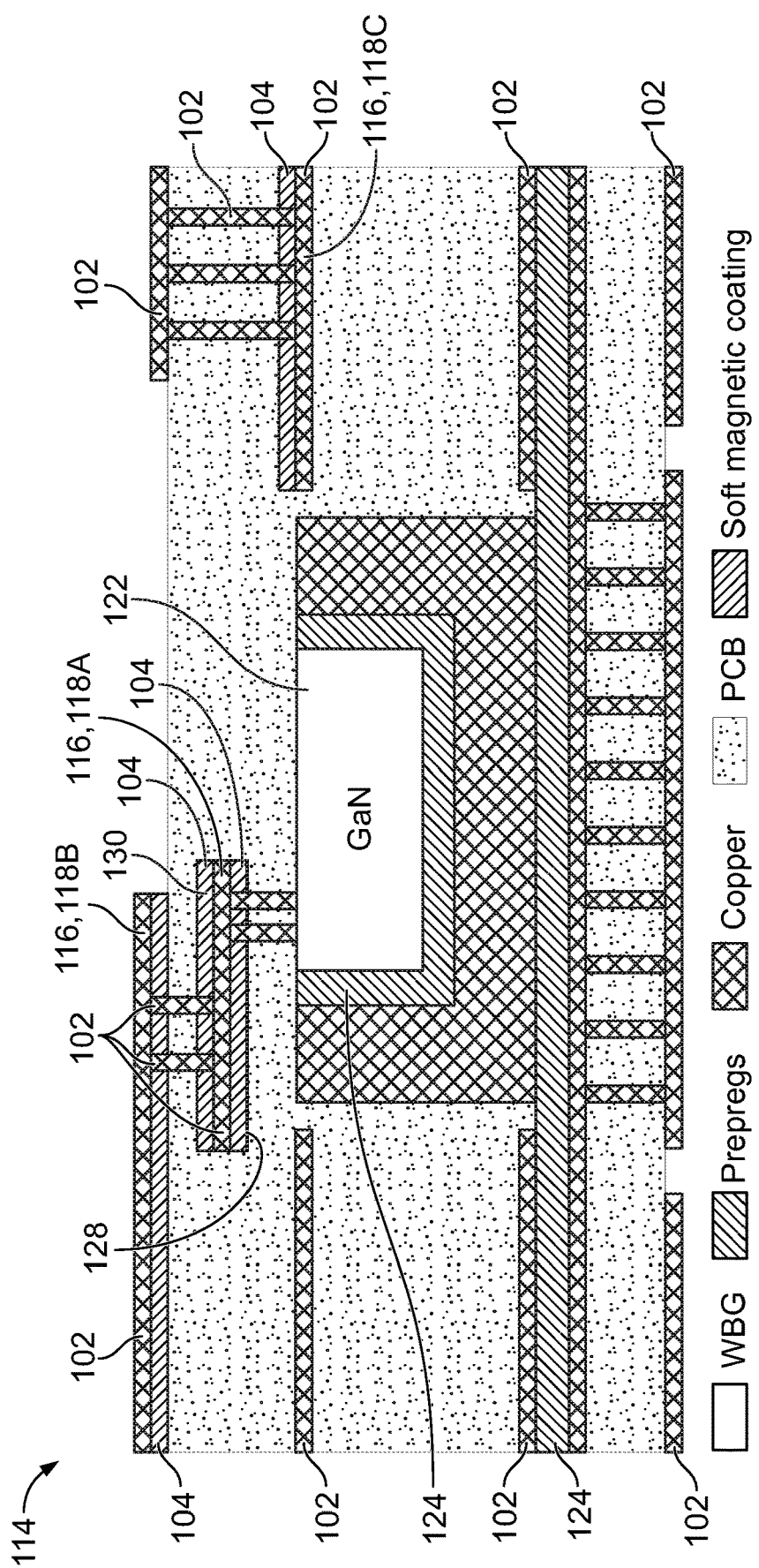
FIG. 6 illustrates a schematic diagram of an exemplary printed circuit board (PCB) of a power electronics device having a plurality conductors, or conductive layers, that include one or more multi-layered conductors according to an illustrated embodiment of the present application.

FIG. 6 illustrates a schematic diagram of an exemplary printed circuit board (PCB) 114 of a power electronics device that has a plurality of conductors 116, or conductive layers, that include one or more multi-layered conductors 118a-c according to an illustrated embodiment of the present application. According to certain embodiments, the multi-layered conductors 118a-c can be formed via providing one or more shielding layers 104 to at least a portion of one or more conductor layers 102 of the multi-layered conductor 118a-c. For example, according to certain embodiments, one or more shielding layers 104 can be applied to one or more conductor layers 102 of a PCB that is used in connection with power conduction in power converters, high frequency transformer windings, and other applications. Further, while the illustrated embodiment is being depicted in connection with use in a PCB 114 used with a wide-bandgap ("WBG") semiconductor, either packaged or bare die, such as, for example, a gallium nitride (GaN) device 122, the multi-layered conductors 118a-c can be incorporated into a variety of other electronic applications, including other high frequency semiconductors such as CoolMOS MOSFET, among other devices, and the illustrated use with a PCB is by way of non-limiting example.

As shown in the example provided by FIG. 6, the plurality of conductors 116, include three multi-layered conductors 118a-c that are positioned about the PCB board or substrate 114. Such a configuration can be designed to attenuate high frequency noise from a power loop in planar mapping. However, additionally, or alternatively, multi-layered conductors 100 such as the three multi-layered conductors 118a-c illustrated in FIG. 6, can also be used with a gate loop. Further, according to the illustrated embodiment, the GaN device 122 can be electrically coupled to one or more of the conductors 116, and be positioned on a prepeg 124. Prepeg 124 can be positioned at various locations along the PCB 114, including, for example, between at least some of the conductors 116 and/or around at least a portion of the GaN device 122.

As shown in the example provided by FIG. 6, a first multi-layered conductor 118a that receives a supply of AC electrical current can include a shielding layer 104 that is position about at least two opposing sides of the first multi-layered conductor 118a. According to such an embodiment, a first side 128 of the shielding layer 104 can be positioned between at least the conductor layer 102 and the GaN device 122 to at least attempt to prevent or minimize EMI being received by the first multi-layered conductor 118a in the general direction from the GaN device 122. A second, opposing, side 130 of the shielding layer 104 can also be provided to prevent and/or minimize the reception of EMI by the first multi-layered conductor 118a in a direction generally away from the second multi-layered conductor 118b. By eliminating or minimizing the high frequencies from the AC power in the shielding layer 104, the GaN device 122 is protected and will not be compromised under high frequencies.

The exemplary PCB 114 also includes a second multi-layered conductor 118b that includes a shielding layer 104 that is positioned on only one side of the conductor layer 102. In such an example, the shielding layer 104 of the second multi-layered conductor 118b is positioned to at least prevent or minimize the multi-layered conductor 118b from receiving EMI at least in the general direction away from at least the first multi-layered conductor 118a and/or the GaN device 122. Similarly, a third multi-layered conductor 118c is also illustrated that includes a shielding layer 104 on only one side of the conductor layer 102. In such an example, the shielding layer 104 of the third multi-layered conductor 118c is positioned to at least prevent or minimize the receiving of EMI from the third multi-layered conductor 118c at least in the general direction of at least the first multi-layered conductor 118a and/or the second multi-layered conductor 118b.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A multi-layered conductor comprising:
   one or more conductor layers comprising an electrically conductive material; and
   one or more shielding layers having a first shield end and an opposing second shield end, at least a portion of the one or more shielding layers between the first shield end and the second shield end being directly attached to at least a portion of an outer surface of the one or more conductor layers, and another portion of the one or more shield layers around the second shield end being detached from an adjacent portion of the outer surface of the one or more conductor layers, the one or more shielding layers comprising a soft magnetic material having a lower conductivity and a higher magnetic permeability than the electrically conductive material of the one or more conductor layers.

2. The multi-layered conductor of claim 1, wherein the one or more conductor layers comprises at least copper.

3. The multi-layered conductor of claim 2, wherein the one or more shielding layers comprises at least nickel.

4. The multi-layered conductor of claim 3, wherein the multi-layered conductor extends from a first end to a second end, and wherein the second portion of the one or more shielding layers that is detached from the one or more conductor layers at least at the second end of the multi-layered conductor.

5. The multi-layered conductor of claim 4, wherein the portion of the one or more shielding layers that is detached from the outer surface is separated from the one or more conductor layers at the second end of the multi-layered conductor by at least one or more insulation layers, the one or more insulation layers comprising a generally electrically non-conductive material.

6. The multi-layered conductor of claim 4, wherein the portion of the one or more shielding layers that is attached to the outer surface is a coating that is deposited on only one side of the outer surface of the one or more conductor layers.

7. The multi-layered conductor of claim 4, wherein the portion of the one or more shielding layers that is attached to the outer surface is a coating that is deposited on only two sides of the outer surface of the one or more conductor layers.

8. The multi-layered conductor of claim 7, wherein the two sides of the outer surface are opposing sides of the one or more conductor layers.

9. A system comprising:
one or more layers of an electrically conductive material arranged on a substrate to provide a plurality of conductors;
a high frequency semiconductor secured to the substrate, the high frequency semiconductor being electrically coupled to one or more of the plurality of conductors; and
one or more layers of a shielding material, a portion of the one or more layers of shielding layers being directly attached to a portion of an outer surface of at least one conductor of the plurality of conductors, the one or more layers of shielding material further including a detached portion that is detached from the outer surface of the at least one conductor such that the detached portion of the one or more layers of the shielding material is separated from the adjacent portion of the outer surface of the at least one conductor, the one or more layers of the shielding material and the one or more layers of the electrically conductive material forming a multi-layered conductor, the one or more layers of the shielding material comprising a material having a lower conductivity and a higher magnetic permeability than the one or more layers of the electrically conductive material.

10. The system of claim 9, wherein the multi-layered conductor has a first end and a second end, wherein, at least at the second end, the at least one conductor and the one or more layers of the shielding material are not electrically attached to the same electrical device, and wherein the shielding material is a soft magnetic material comprising at least one of the following: ferrite, nickel, and cobalt.

11. The system of claim 10, wherein, at the second end of the multi-layered conductor, the one or more layers of the shielding material are electrically attached to at least one of a capacitor and a capacitor/resistor combination.

12. The system of claim 10, further including an insulator layer positioned at the second end of the multi-layered conductor between the detached portion of the one or more layers of the shielding material and the outer surface of the at least one conductor.

13. The system of claim 9, wherein the one or more layers of a shielding material is attached to only one side of the at least one conductor.

14. The system of claim 9, wherein the one or more layers of a shielding material is attached to only two sides of the at least one conductor.

* * * * *